ˍˍˍˍˍˍˍˍˍˍˍˍˍˍˍˍˍˍˍˍˍˍˍˍˍˍ US010527362B2

(12) United States Patent
Vos et al.

(10) Patent No.: US 10,527,362 B2
(45) Date of Patent: Jan. 7, 2020

(54) INTEGRATED MULTI-CHAMBER HEAT EXCHANGER

(71) Applicant: Lockheed Martin Corporation, Owego, NY (US)

(72) Inventors: David L. Vos, Apalachin, NY (US); Ryan M. Alderfer, Binghamton, NY (US); Matthew Daniel Miller, Chenango Forks, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 122 days.

(21) Appl. No.: 14/860,527

(22) Filed: Sep. 21, 2015

(65) Prior Publication Data
US 2017/0082372 A1    Mar. 23, 2017

(51) Int. Cl.
| *F28F 7/02* | (2006.01) |
| *F28D 20/02* | (2006.01) |
| *F28F 1/02* | (2006.01) |
| *H01L 23/473* | (2006.01) |
| *B23P 15/26* | (2006.01) |
| *F28F 21/08* | (2006.01) |
| *H01L 23/367* | (2006.01) |

(52) U.S. Cl.
CPC .............. *F28F 7/02* (2013.01); *B23P 15/26* (2013.01); *F28D 20/02* (2013.01); *F28F 1/02* (2013.01); *H01L 23/473* (2013.01); *F28F 21/08* (2013.01); *H01L 23/3672* (2013.01); *Y02E 60/145* (2013.01)

(58) Field of Classification Search
CPC ............ H01L 23/473; F28F 1/022; F28F 7/02

USPC ........................................................ 165/80.4
See application file for complete search history.

(56) References Cited

U.S. PATENT DOCUMENTS

| 4,101,287 A * | 7/1978 | Sweed | ..................... B01J 8/067 165/165 |
| 4,421,702 A * | 12/1983 | Oda | ......................... F28F 7/02 264/209.8 |
| 4,746,479 A * | 5/1988 | Hanaki | ................... B28B 3/269 264/150 |

(Continued)

FOREIGN PATENT DOCUMENTS

| CN | 204329698 U | 5/2015 | |
| DE | 102013010850 A1 * | 12/2014 | ........... B60H 1/2225 |

(Continued)

OTHER PUBLICATIONS

International Search Report and Written Opinion for Application No. PCT/US2016/052080 dated Jan. 17, 2017.
(Continued)

*Primary Examiner* — Devon Russell
(74) *Attorney, Agent, or Firm* — Wolf, Greenfield & Sacks, P.C.

(57) ABSTRACT

A one-piece heat exchanger manufactured using an additive manufacturing process is described. The heat exchanger includes a plurality of channels formed therein. At least some of the plurality of channels may be configured to provide structural support to the heat exchanger to reduce its weight. Different coolant media may be used in a first set and a second set of the plurality of channels to provide different types of cooling in an integrated one-piece heat exchanger structure.

16 Claims, 18 Drawing Sheets

(56) References Cited

U.S. PATENT DOCUMENTS

| | | | | |
|---|---|---|---|---|
| 5,527,588 | A * | 6/1996 | Camarda | B32B 3/20 257/E23.088 |
| 5,851,636 | A * | 12/1998 | Lang | A01K 67/027 156/290 |
| 6,152,215 | A * | 11/2000 | Niggemann | F28D 9/04 165/104.33 |
| 6,301,109 | B1 * | 10/2001 | Chu | F28F 3/12 165/165 |
| 6,478,082 | B1 * | 11/2002 | Li | F28F 3/02 165/185 |
| 6,623,687 | B1 * | 9/2003 | Gervasi | F28F 7/02 264/308 |
| 6,935,414 | B2 * | 8/2005 | Kawakubo | F25B 40/00 165/110 |
| 6,987,318 | B2 * | 1/2006 | Sung | H01L 23/373 257/720 |
| 7,147,041 | B2 * | 12/2006 | Mitchell | H01L 23/367 165/185 |
| 7,298,620 | B2 * | 11/2007 | Wu | F28D 15/0275 165/80.4 |
| 7,687,132 | B1 * | 3/2010 | Gross | B22F 1/0007 385/129 |
| 7,987,899 | B2 * | 8/2011 | Kurtz | F28F 3/048 165/168 |
| 8,192,832 | B1 * | 6/2012 | Lang | F28D 17/02 165/166 |
| 8,257,809 | B2 * | 9/2012 | Morrison | B32B 18/00 428/161 |
| 8,453,717 | B1 * | 6/2013 | Roper | F28F 7/02 165/80.4 |
| 9,086,229 | B1 * | 7/2015 | Roper | B29C 41/02 |
| 9,228,785 | B2 * | 1/2016 | Poltorak | F28F 21/02 |
| 9,229,162 | B1 * | 1/2016 | Roper | G02B 6/1221 |
| 9,405,067 | B2 * | 8/2016 | Yang | G02B 6/138 |
| 9,453,604 | B1 * | 9/2016 | Maloney | F16L 41/00 |
| 9,660,573 | B2 * | 5/2017 | DiPietro | H02S 40/425 |
| 9,683,756 | B2 * | 6/2017 | Barmore | F24J 2/0422 |
| 9,731,471 | B2 * | 8/2017 | Schaedler | B32B 3/12 |
| 2002/0125001 | A1 * | 9/2002 | Kelly | F28F 7/02 165/165 |
| 2003/0141048 | A1 * | 7/2003 | Lee | F28D 1/05383 165/177 |
| 2003/0173720 | A1 * | 9/2003 | Musso | C04B 38/0006 264/635 |
| 2003/0227732 | A1 * | 12/2003 | Dessiatoun | H01L 23/427 361/103 |
| 2005/0128702 | A1 * | 6/2005 | Mongia | H01L 23/473 361/688 |
| 2005/0236142 | A1 * | 10/2005 | Boudreaux | F28F 3/02 165/80.3 |
| 2006/0175048 | A1 * | 8/2006 | Hong | F28F 7/02 165/146 |
| 2007/0121294 | A1 | 5/2007 | Campbell et al. | |
| 2007/0133175 | A1 | 6/2007 | Wu | |
| 2007/0207186 | A1 * | 9/2007 | Scanlon | A61F 2/07 424/424 |
| 2008/0124423 | A1 * | 5/2008 | Peterson | B23P 15/243 425/467 |
| 2008/0257530 | A1 * | 10/2008 | Burk | F25B 35/04 165/104.19 |
| 2009/0169445 | A1 * | 7/2009 | Caze | B01J 19/2485 422/222 |
| 2009/0313993 | A1 * | 12/2009 | Bausch | F28F 3/086 60/616 |
| 2010/0108292 | A1 * | 5/2010 | Bhunia | H01L 23/467 165/80.3 |
| 2010/0143215 | A1 * | 6/2010 | Caze | B01J 19/0073 422/198 |
| 2010/0174124 | A1 * | 7/2010 | Tonkovich | B01J 19/0093 585/23 |
| 2011/0209742 | A1 * | 9/2011 | Narayanamurthy | F24D 11/003 136/246 |
| 2011/0306088 | A1 * | 12/2011 | Chen | B01J 19/2485 435/41 |
| 2012/0015082 | A1 * | 1/2012 | Holst | A23C 3/037 426/241 |
| 2012/0061065 | A1 | 3/2012 | LaCombe | |
| 2012/0300402 | A1 | 11/2012 | Vos | |
| 2013/0058042 | A1 * | 3/2013 | Salamon | H01L 23/3672 361/700 |
| 2014/0001604 | A1 * | 1/2014 | Sadaka | H01L 23/473 257/621 |
| 2014/0140829 | A1 * | 5/2014 | Blair | F01D 25/10 415/177 |
| 2015/0137412 | A1 * | 5/2015 | Schalansky | B22F 3/1055 264/129 |
| 2016/0230595 | A1 | 8/2016 | Wong et al. | |
| 2016/0320149 | A1 * | 11/2016 | Poltorak | F28D 15/00 |
| 2017/0003078 | A1 * | 1/2017 | Vadder | F28F 25/08 |
| 2017/0082371 | A1 | 3/2017 | Vos et al. | |
| 2017/0097197 | A1 * | 4/2017 | Poltorak | F28F 21/02 |
| 2017/0198990 | A1 * | 7/2017 | Turney | F28D 7/106 |
| 2017/0205149 | A1 * | 7/2017 | Herring | F28F 1/025 |
| 2018/0043480 | A1 | 2/2018 | Vos et al. | |
| 2018/0043481 | A1 | 2/2018 | Vos et al. | |
| 2018/0043482 | A1 | 2/2018 | Vos et al. | |

FOREIGN PATENT DOCUMENTS

| | | |
|---|---|---|
| WO | WO 2011/115883 A2 | 9/2011 |
| WO | WO 2015/126483 A2 | 8/2015 |

OTHER PUBLICATIONS

U.S. Appl. No. 14/860,563, filed Sep. 21, 2015, Vos et al.
U.S. Appl. No. 15/723,365, filed Oct. 3, 2017, Vos et al.
U.S. Appl. No. 15/723,384, filed Oct. 3, 2017, Vos et al.
U.S. Appl. No. 15/723,395, filed Oct. 3, 2017, Vos et al.
Chinese office action for Application No. 201680054384.2 dated Jun. 3, 2019.

* cited by examiner

INTEGRATED MULTI-CHAMBER HEAT EXCHANGER

BACKGROUND

Heat exchangers are used in products across many industries including the military, automotive, and electronics industries to prevent overheating of components when the components are in operation. A heat exchanger provides temperature regulation by transferring heat away from heat-generating components located near and/or coupled to the heat exchanger. The heat exchanger includes materials with high thermal conductivity, which transfer heat away from the components and into a coolant (e.g., air, water) circulating through the heat exchanger, which transports the heat away from the components to prevent overheating.

SUMMARY

Some embodiments are directed to a heat exchanger. The heat exchanger comprises a one-piece body and a plurality of channels formed in the one-piece body, wherein at least some of the plurality of channels form a lattice having layers of repeating shapes in a first dimension of the one-piece body, wherein the repeating shapes of the lattice have successively-smaller dimensions across the layers in the first dimension of the one-piece body.

Other embodiments are directed to a method of manufacturing a heat exchanger. The method comprises forming, using an additive manufacturing process, a one-piece body and a plurality of channels formed therein, wherein at least some of the plurality of channels form a lattice having layers of repeating shapes in a first dimension of the one-piece body, wherein the repeating shapes of the lattice have successively-smaller dimensions across the layers in the first dimension of the one-piece body.

Other embodiments are directed to a method of cooling a component with a heat exchanger. The method comprises arranging the heat exchanger adjacent to the component, wherein the heat exchanger comprises a plurality of channels, wherein at least some of the plurality of channels form a lattice having layers of repeating shapes in a first dimension of the heat exchanger, wherein the repeating shapes of the lattice have successively-smaller dimensions across the layers in the first dimension.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Some conventional heat exchangers are fabricated using techniques that require the use of expensive equipment that operates at high temperatures. Other fabrication techniques that use lower temperatures typically produce heat exchangers with poorer thermal conductivity due to the bonding materials used during the fabrication process. The inventors have recognized and appreciated that conventional techniques for fabricating heat exchangers may be improved by using an additive manufacturing process that produces a one-piece heat exchanger structure that does not use conventional brazing or bonding techniques. The use of additive manufacturing also enables the fabrication of heat exchangers having channel designs that are not possible or practical using other fabrication techniques, as discussed in more detail below.

Figure 1:
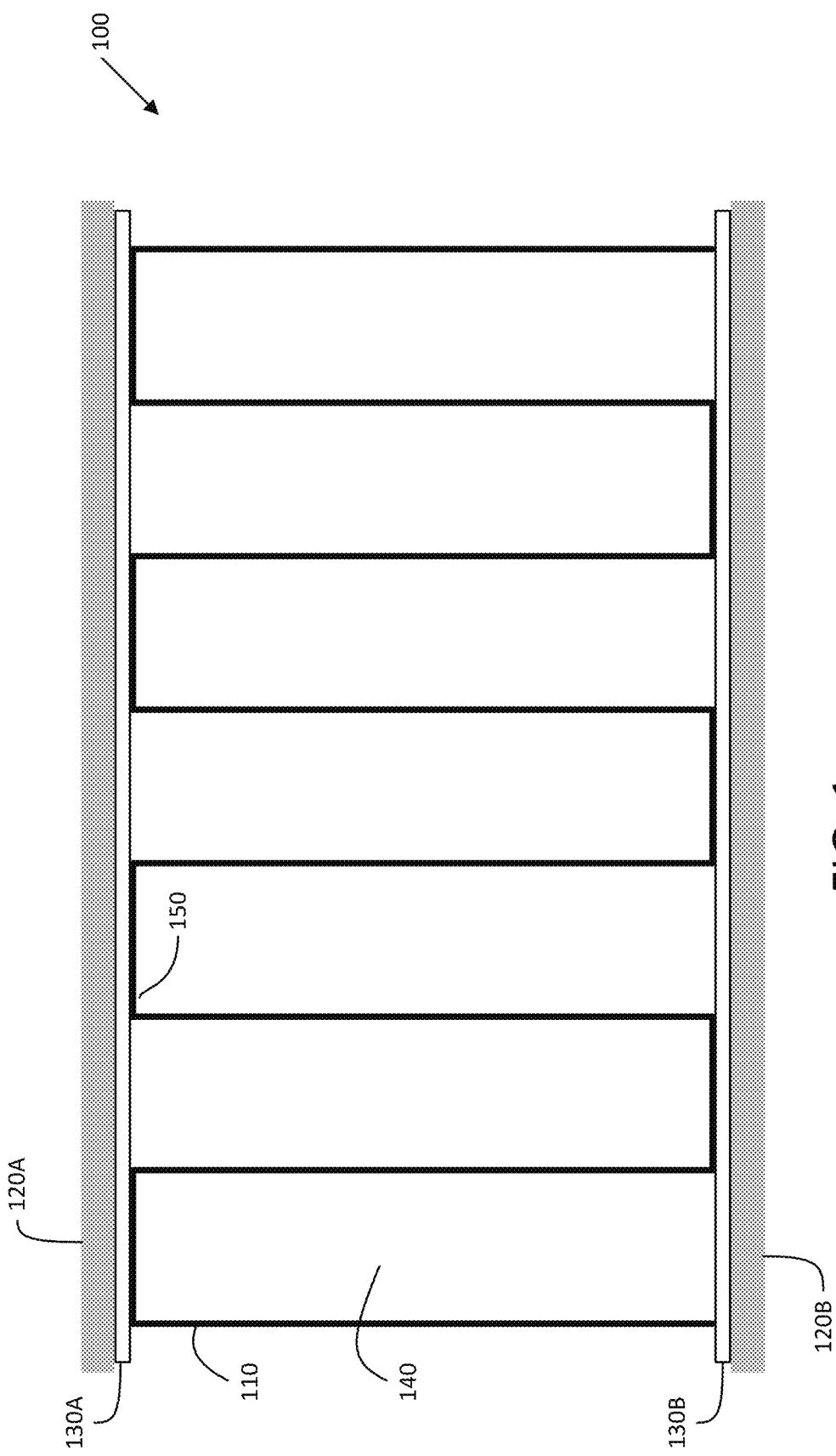
FIG. 1 shows a cross-section through a conventional heat exchanger including a plurality of fins forming a rectangular pattern.

FIG. 1 schematically illustrates a cross-section through an example of a conventional heat exchanger 100 in which thin fins 110 form a rectangular pattern between an upper base plate 120A and a lower base plate 120B. The fins 110 are bonded to the upper base plate 120A and the lower base plate 120B by bonding layers 130A and 130B, respectively. Fins 110 may be made of any suitable material or materials having a high thermal conductivity. For example, fins 110 may be made of aluminum or another suitable metal. A coolant (e.g., air) is passed through the channels 140 formed by the rectangular pattern of the fins 110. Heat generated from a component located adjacent to the heat exchanger is transferred via one or both of the upper and lower base plates to the fins 110 having a high thermal conductivity. The heat is then further transferred to the coolant in channels 140 and is carried away to prevent overheating of the component.

Bonding of fins 110 to the upper and lower base plates is often performed using a molten solder bath or vacuum brazing process in which metal-based braze interface materials are used at high-temperatures (e.g., 300C to 1100C) to attach the fins to the base plates. However, such processes are expensive, time-consuming, and have the potential for latent corrosion. An alternative process for bonding fins 110 to the base plate(s) is to use epoxies or other organic (e.g., polymer-based) interface materials. Using organic bonding materials provides a simpler bonding process than bonding using metal-based brazing due, in part, to lower curing temperatures (e.g., 100C to 150C). However, the bond formed by the organic interface materials generally has poor thermal conductivity resulting in a heat exchanger with poorer thermal conducting properties than heat exchangers fabricated using brazing. Although some organic bonding materials may include highly-conductive particles (e.g., alumina, boron nitride, diamond dust, silver, gold, aluminum) to improve the thermal conductivity of the materials, the thermal conductivity of such materials remains inferior to the metal-based brazing process described above.

The inventors have recognized and appreciated that conventional processes for manufacturing heat exchangers may be improved by using additive manufacturing (e.g., 3D printing) techniques, which result in a one-piece construction for the heat exchanger that does not require the use of fixtures, fasteners, or the bonding techniques described above. By not using bond interface materials the thermal conductive properties of the heat exchanger are improved, and the costs and time-delay associated with conventional brazing techniques are reduced. In particular, additive fabricated metal alloys have a substantially higher thermal conductivity compared to organic bond material. Additionally, the use of additive manufacturing to create a heat exchanger enables the creation of new heat exchanger designs that incorporate structural support within the channel design itself and/or allow for multiple types of coolant media to be used within a single heat exchanger, as discussed in more detail below.

Additive manufacturing techniques are used to fabricate a 3D structure by building up consecutive thin layers of a material (e.g., metal alloy) based on a 3D design for the structure specified in an electronic file. A wide variety of shapes can be fabricated using additive manufacturing. However, designs that include unsupported overhangs (e.g., overhang 150 shown in FIG. 1) cannot be produced using additive manufacturing without the incorporation of additional supporting structures used during fabrication, and that may remain or be removed after fabrication. When such supporting structures are removed after fabrication the structural integrity of the overhangs may be compromised. Accordingly, the ability of additive manufacturing techniques to produce orthogonal structures, such as the repeating rectangular structure shown in FIG. 1, which includes unsupported overhangs, is limited.

The inventors have also recognized and appreciated that additive manufacturing enables the fabrication of channel designs in heat exchangers that are not practical or possible using conventional techniques for manufacturing heat exchangers, including the brazing and bonding techniques discussed above. For example, additive manufacturing allows for the use of internal lattice structures, which cannot be machined from solid material. As discussed in more detail below, additive manufacturing may be used to create entirely- or partially-self-supporting channels for a heat exchanger that do not have unsupported overhangs and do not require the use of separate support structures (e.g., upper base plate 120A or lower base plate 120B).

The design flexibility afforded by the use of additive manufacturing also enables an optimization of one or more factors in designing a heat exchanger including, but not limited to, size, weight, channel wall stiffness, power cooling capacity, and manufacturing cost. Additionally, intricate manifold structures may be incorporated within the heat exchanger using additive manufacturing to enable more complex control of coolant flow in the channels of the heat exchanger.

Figure 2:
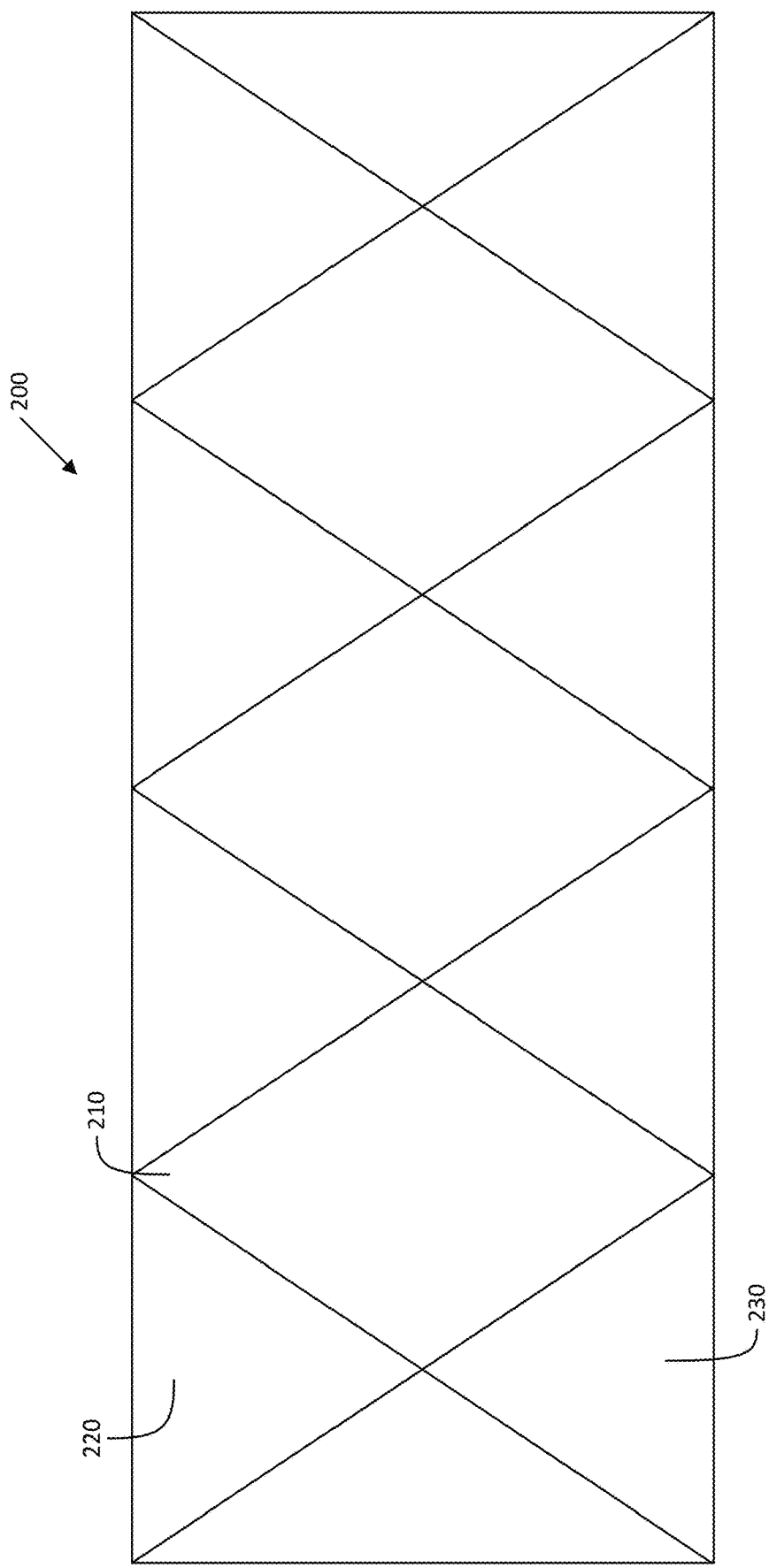
FIG. 2 shows a cross-section through a heat exchanger including a plurality of channels in accordance with some embodiments.

FIG. 2 shows a schematic illustration of a cross-section through a heat exchanger 200 in accordance with some embodiments. Heat exchanger 200 includes a plurality of diamond-shaped channels 210 that replace the repeating rectangular channel design of FIG. 1. The diamond-shaped channels 210 do not include unsupported overhang sections and thus do not necessarily require additional support structures when fabricated using additive manufacturing. Depending on the particular shape of the channel used, some support may be necessary to reinforce sides of one or more of the channels. For example, in some embodiments, one or more of upper triangle channels 220 or lower triangle channels 230 may be filled with supporting material to reinforce the structure of diamond-shaped channels 210. Additionally, or alternatively, one or more upper triangle channels 220 and/or lower triangle channels 230 may be filled with coolant to provide a single-mode or multi-mode heat exchanger, as discussed in more detail below.

The heat exchanger channels designed in accordance with some embodiments of the invention may have any suitable dimensions. For example, in one implementation the dimensions of the sides of diamond-shaped channels 210 may be 0.106 inches and the dimensions of the triangle channels 220, 230 may be 0.106×0.106×0.146 inches with a channel wall thickness of 0.015 inches. It should be appreciated that these dimensions are provided merely for illustration and any suitable channel dimensions and channel shapes may alternatively be used.

Figure 3:
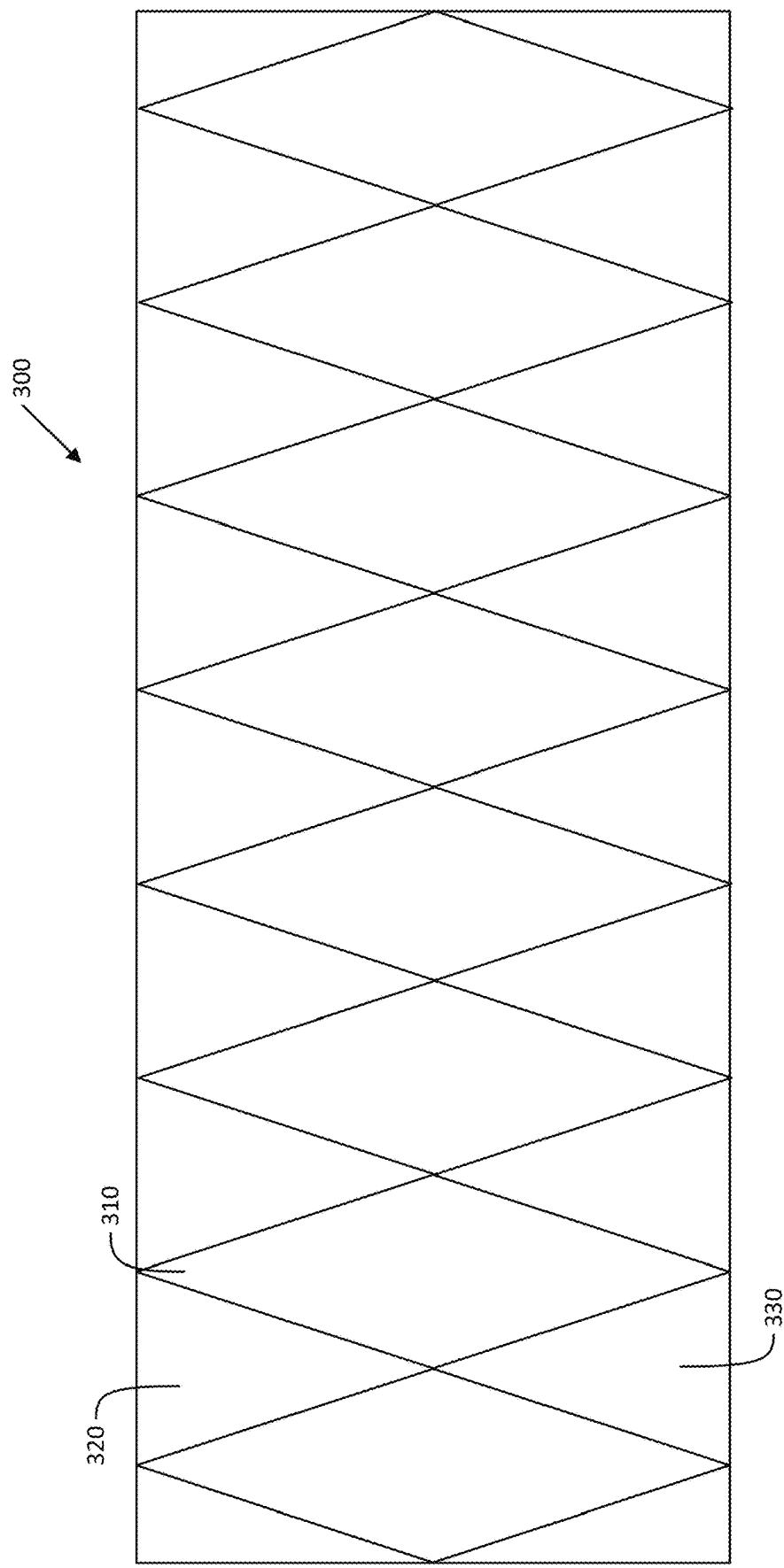
FIG. 3 shows an alternate channel design for a heat exchanger in accordance with some embodiments.

The channel pattern in heat exchanger 200 includes diamond-shaped channels having sides oriented at 45°. However, diamond-shaped channels having other orientations may also be used. FIG. 3 illustrates a cross-section though a heat exchanger 300 having an alternative channel design in which the pitch of the sides of diamond-shaped channels 310 is steeper than 45°. Such a design increases the number of diamond-shaped channels 310, upper triangle channels 320, and lower triangle channels 330 in the repeating pattern for a heat exchanger having the same length as the heat exchanger shown in FIG. 2.

Figure 4:
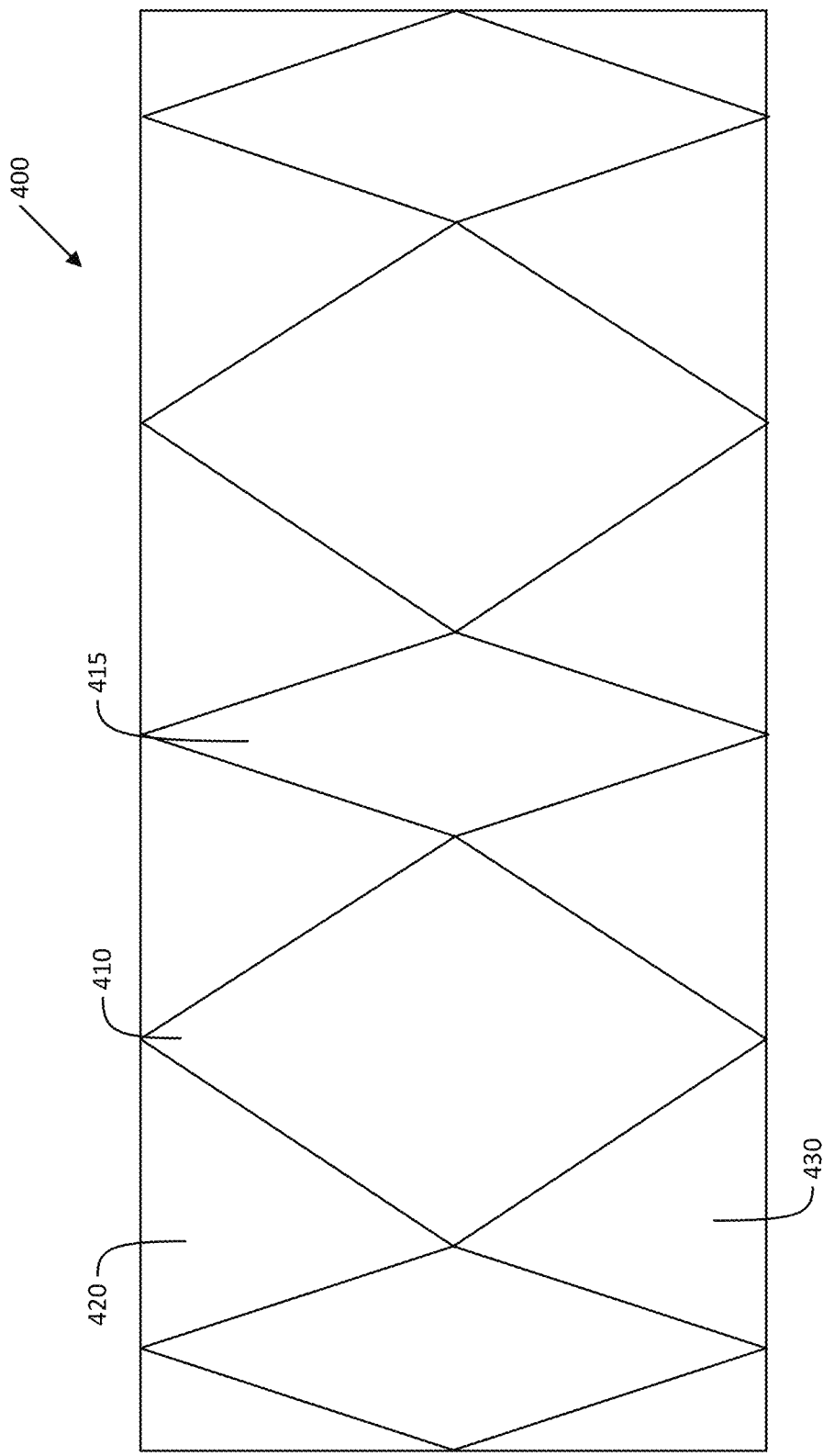
FIG. 4 shows an additional alternate channel design for a heat exchanger in accordance with some embodiments.

The channel designs illustrated in FIGS. 2 and 3 incorporate the same channel element (e.g., diamonds and triangles) repeated across the length of the heat exchanger. However, channel designs for a heat exchanger in accordance with embodiments are not so limited, and any suitable channel design that provides adequate support for the channels in the design may alternatively be used. FIG. 4 illustrates another channel design in which two different diamond-shaped channels (e.g., wide-diamond channels 410 and narrow-diamond channels 415) alternate across the length of the heat exchanger. Upper triangle channels 420 and lower triangle channels 430 may correspondingly take any suitable shape and may be filled with solid material to provide structural support or may be unfilled, as described above.

Other shapes and patterns for channel designs for use in heat exchangers in accordance with some embodiments are also possible. For example, although diamond and triangle-shaped channels are described herein, other shapes including, but not limited to, hexagons, pyramids, circles, and ovals, may also be used. In some embodiments, the shape and/or pattern of channels in the heat exchanger may be determined based, at least in part, on the type of coolant used, the amount of coolant desired, the number of different types of coolant used in the heat exchanger, the pressure of the coolant used in the channels, the amount of fill support required, any other suitable factor, or any combination of these factors.

As discussed above, some embodiments include at least one channel filled with a solid material to provide support for other channels of the heat exchanger. For example, at least some of the upper or lower triangle channels shown in FIGS. 2-4 may be filled with solid material to provide support for the diamond-shaped channels of the heat exchanger. The inventors have recognized and appreciated that the fill volume of the heat exchanger may be reduced by including additional channels within at least some of the channels to increase the number of available channels for coolant as well as providing additional structural stability to the channel design. Although the structures at least partially filled in with solid material are referred to as "channels" herein, it should be appreciated that when fabricated using additive manufacturing, no channel is actually formed. Rather, solid material is formed in layers where the channel would have been fabricated.

Figure 5:
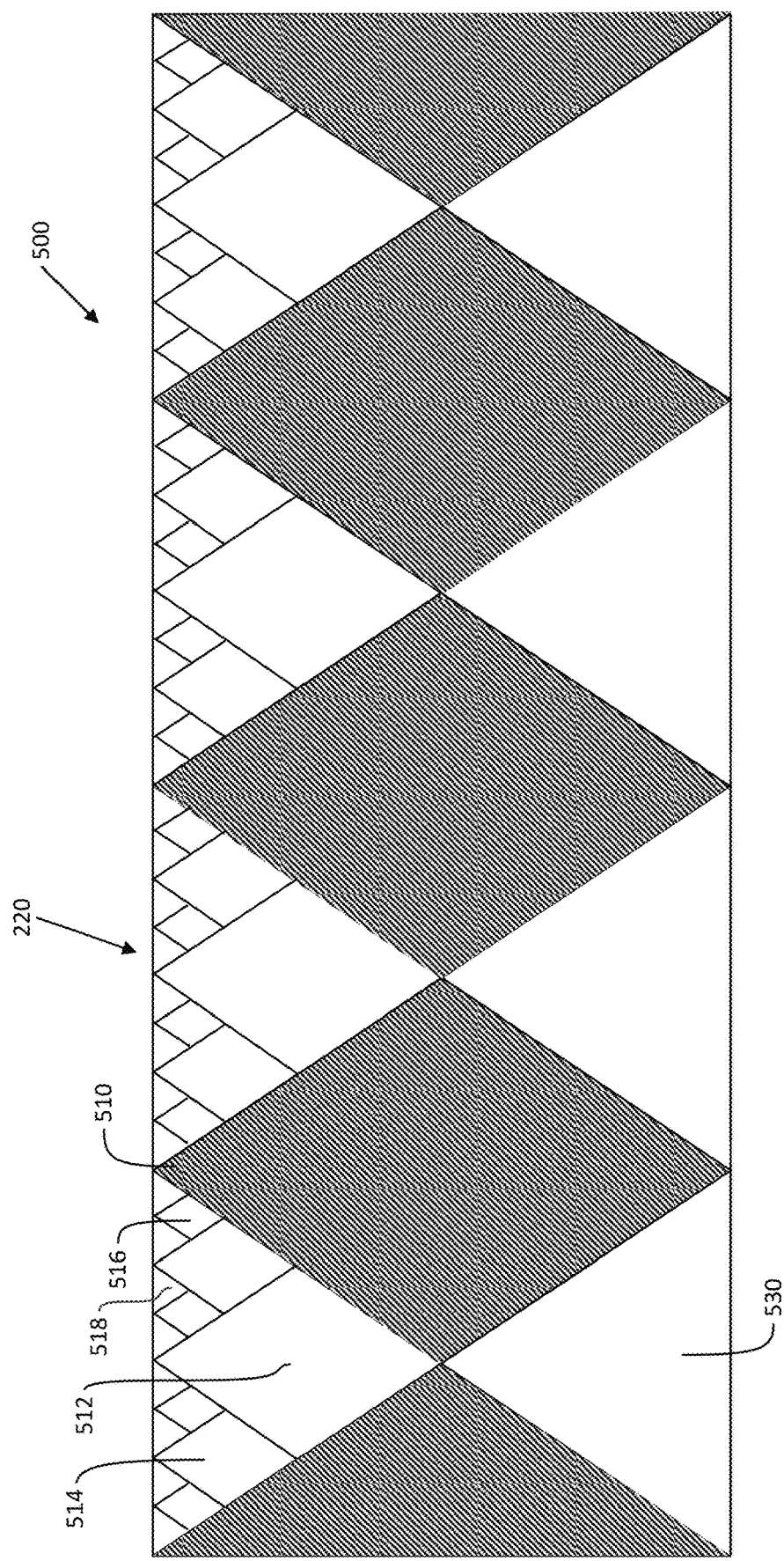
FIG. 5 shows a cross-section through a heat exchanger having a channel pattern with repeating elements of different sizes in accordance with some embodiments.

FIG. 5 illustrates a cross-section through a heat exchanger 500 having a plurality of channels arranged in a repeating structure along the length dimension of the heat exchanger and also in a direction orthogonal to the length dimension. Heat exchanger 500 includes a plurality diamond-shaped channels 510, upper triangle channels 220, and lower triangle channels 230 forming a repeating pattern along the length dimension of the heat exchanger. As shown, each of the upper triangle channels 220 includes multiple layers of successively-smaller diamond-shaped channels and an uppermost layer of triangle channels. Diamond-shaped channels 512 form a first layer of smaller channels above channels 510, diamond-shaped channels 514 form a second layer of even smaller channels above channels 512, and diamond-shaped channels 516 form a third layer of even smaller channels above channels 514.

Adding additional channels improves the structural integrity of the channel structures in the heat exchanger by providing an internal lattice structure and provides additional flexibility in how coolants may be used in accordance with various embodiments. For example, as discussed in more detail below, heat exchangers in accordance with some embodiments may include multiple coolants, and each of the multiple coolants may be housed in a set of channels having a particular configuration.

A fourth layer of triangle channels 518 is formed above channels 516. In some embodiments, at least some of triangle channels 518 may be filled with a solid material to form an interface control upper surface of heat exchanger 500. As shown, the interface control upper surface is a substantially-flat surface. However, it should be appreciated that in other embodiments, the heat exchanger may include an interface control surface that is formed by one or more non-flat shapes. Filling in only an upper layer of triangles with solid material decreases the fill-for-support volume of the heat exchanger, which results in a lighter heat exchanger design than if larger portions of the structure (e.g., upper triangle channel 220) was filled with solid material.

Figure 6:
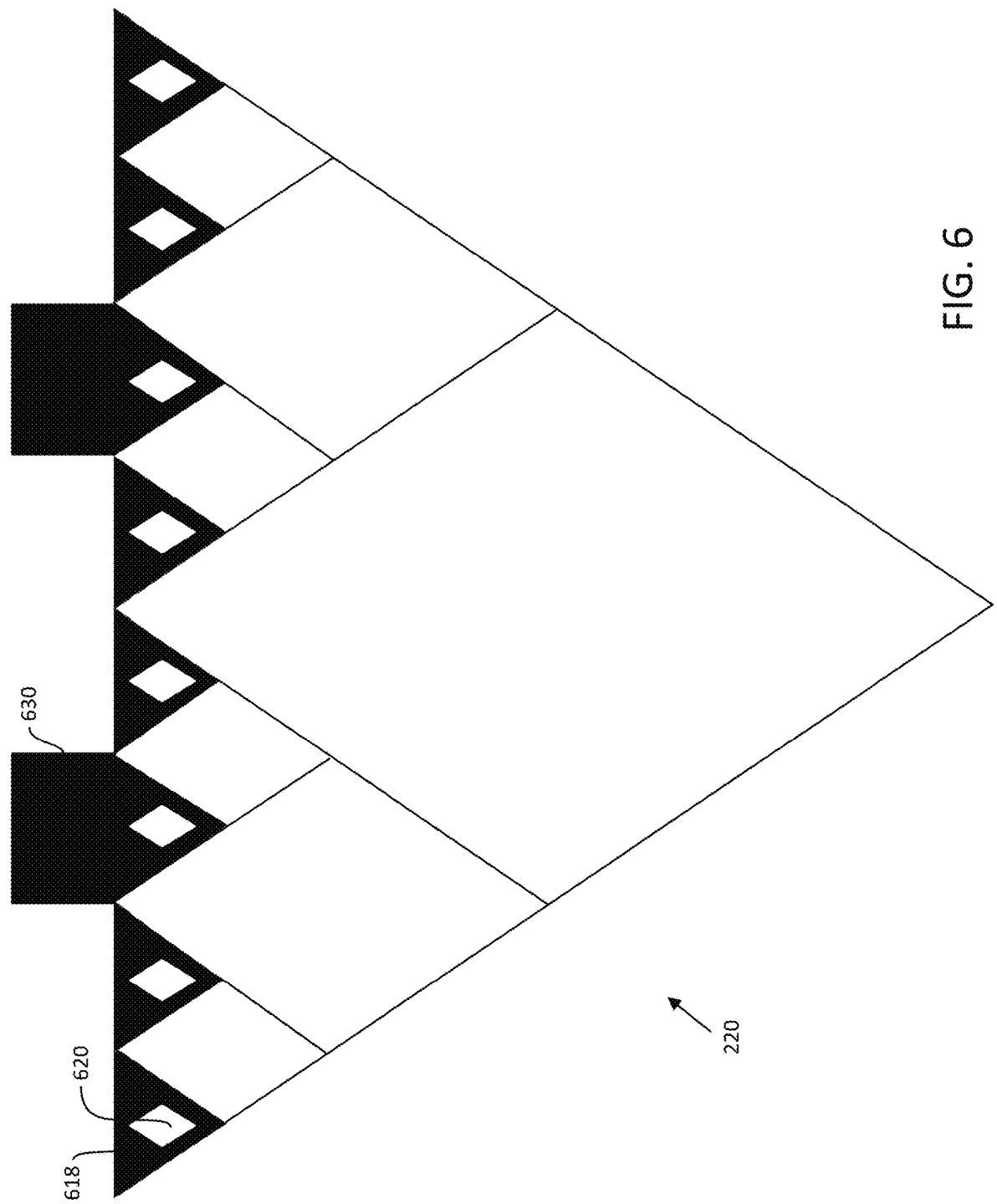
FIG. 6 shows a zoomed in version of some of the channels in the channel pattern of FIG. 5 in accordance with some embodiments.

In some embodiments, more than a single upper row of channels may be filled with a solid material to provide additional support, if needed for a particular application. In yet further embodiments, one or more of the channels filled with solid material may be only partially filled with solid material to further reduce the weight of the heat exchanger. FIG. 6 shows an enlarged view of upper triangle channel 220 within which a plurality of layers of successively-smaller diamond-shaped channels are formed. As shown, the top layer of triangle channels 618 is filled with solid material to provide a substantially-flat solid surface on one side of the heat exchanger. To reduce the weight of the heat exchanger, one or more of triangle channels 618 includes a hollow portion providing another channel 620 within triangle channel 618. As shown, the channel 620 is formed as a diamond-shaped channel. However, it should be appreciated that any shape channel may be formed inside of the top layer of channel(s) 618, and embodiments are not limited in this respect.

In some embodiments, heat exchangers designed in accordance with some embodiments may include one or more mounting structures 630 attached to the surface of the heat exchanger configured to mount the heat exchanger to another component to be cooled as shown in FIG. 6. For example, mounting structures 630 may be card guide rails or slots configured to be connected to one or more electronic cards. Alternatively, mounting structures may be configured to connect to any other heat source, and embodiments are not limited in this respect.

During the additive manufacturing process, the mounting structures 630 may be formed as a continuous extension of the one-piece body of the heat exchanger such that one or more of the triangle channels 618 at least partially filled with solid material transfers heat from the mounting structures 630 to the solid material in the triangle channel to facilitate heat transfer in the heat exchanger. Mounting structures 630 may have any suitable dimensions and may be placed at any location along a surface of the heat exchanger. For example, in one implementation the width of mounting structures 630 is 0.018 inches and the mounting structures are formed directly above every other triangle channel 618. Additional examples of heat exchangers including mounting structures 630 are discussed in further detail below.

Although four repeating layers of shapes (e.g., diamonds) with successively-smaller dimensions are shown in FIG. 5, it should be appreciated that any suitable combination of shapes and dimensions may alternatively be used, and the design shown in FIG. 5 is merely one implementation. For example, a number of layers less than or greater than four may alternatively be used, and embodiments are not limited in this respect. Additionally, other types of shapes including, but not limited to, hexagons, pyramids, circles, and ovals, may instead be used.

Figure 7:
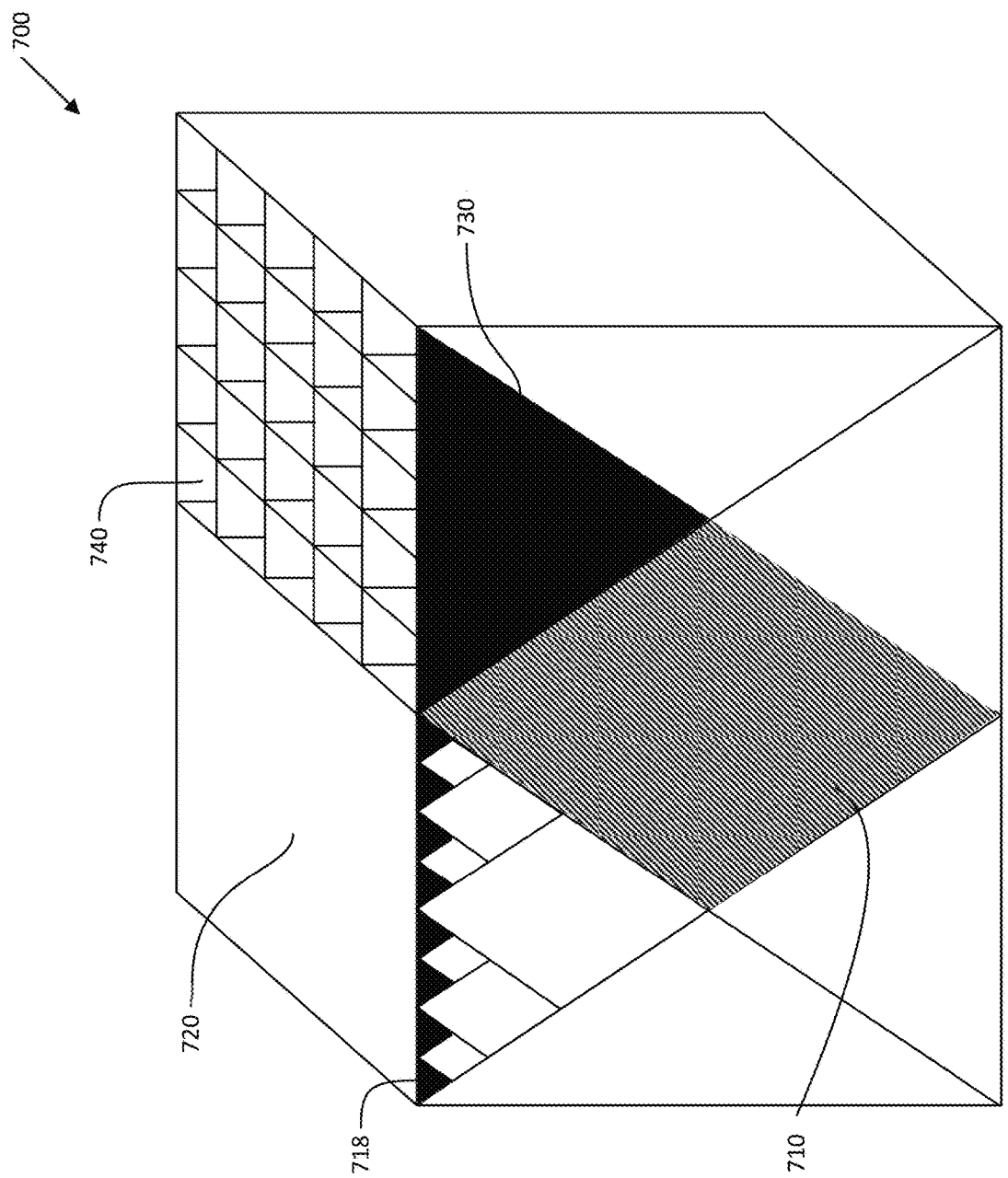
FIG. 7 shows a three-dimensional representation of a heat exchanger in accordance with some embodiments.

FIG. 5 illustrates that the same repeating pattern may be used along the entire length dimension of heat exchanger 500. In other embodiments, different patterns of channels may be used at different locations along the length dimension of the heat exchanger. FIG. 7 illustrates a heat exchanger 700, designed in accordance with some embodiments, that incorporates different patterns of channels along a length dimension of the heat exchanger. As shown, heat exchanger 700 includes a centrally-located diamond shaped channel 710. The upper-left triangle of heat exchanger 700 includes a channel structure similar to that described in connection with FIG. 5. In particular, the channel structure in the upper-left triangle comprises a plurality of levels of successively-smaller diamond-shaped channels. The top level of triangle channels 718 are shown filled with a solid material to provide a substantially-flat solid surface 720.

The inventors have recognized and appreciated that additive manufacturing enables the creation of heat exchangers that may include channels formed in any direction of the heat exchanger including horizontal channels, vertical channels, channels formed at an angle, or any combination thereof. For example, the upper-right triangle of heat exchanger 700 includes a channel structure different than the channel structure in the upper-left triangle. As shown, the upper-right triangle is filled with a solid material along the length direction of the heat exchanger, and a plurality of vertical channels 740 are formed in the right side portion of the heat exchanger. Vertical channels 740 are shown as rectangular channels. However, it should be appreciated that any shape of channels may alternatively be used including, but not limited to the repeating shape channel structure shown in the upper left triangle channel of heat exchanger 700.

Any suitable material may be used to form the walls of channels in a heat exchanger in accordance with the techniques described herein, provided that the material is compatible with additive manufacturing. For example, the material used to form the channels may include, but is not limited to, metal, ceramic, glass, carbon-based materials (e.g., diamond), or any other suitable material that provides sufficient heat transfer for a particular heat exchange application.

Additionally, any suitable coolant or coolants may be used in conjunction with the heat exchangers described herein. For example, any fluid or combination of fluids (e.g., various mixtures, emulsions or slurries of different fluids, compounds and/or particles) may be used including fluids in liquid or gas state, or phase change material (e.g., heat pipe, paraffin), capable of absorbing and transporting heat. Other cooling fluids such as liquid nitrogen, outgassing of solid carbon dioxide, refrigerated and compressed air, ammonia, antifreeze, polyalphaolefin (PAO) coolant, etc., may also be utilized in conjunction with various embodiments, as the aspects are not limited in this respect.

Some conventional heat exchangers are configured to provide single-mode cooling by using air, liquid, or some other coolant as a heat transport medium to provide thermal regulation, as discussed above. Multi-mode cooling may be provided by attaching multiple single-mode cooling heat exchangers together. However, multi-mode heat exchangers formed from a combination of multiple independent single-mode cooling heat exchangers are bulky and have a reduced thermal efficiency at the interface between the single-mode heat exchangers. For example, a fluidic heat exchanger attached to an independent heat exchanger that incorporates phase-change material requires both more volume and suffers from a poor thermal interface between the two single-mode heat exchangers.

Figure 8:
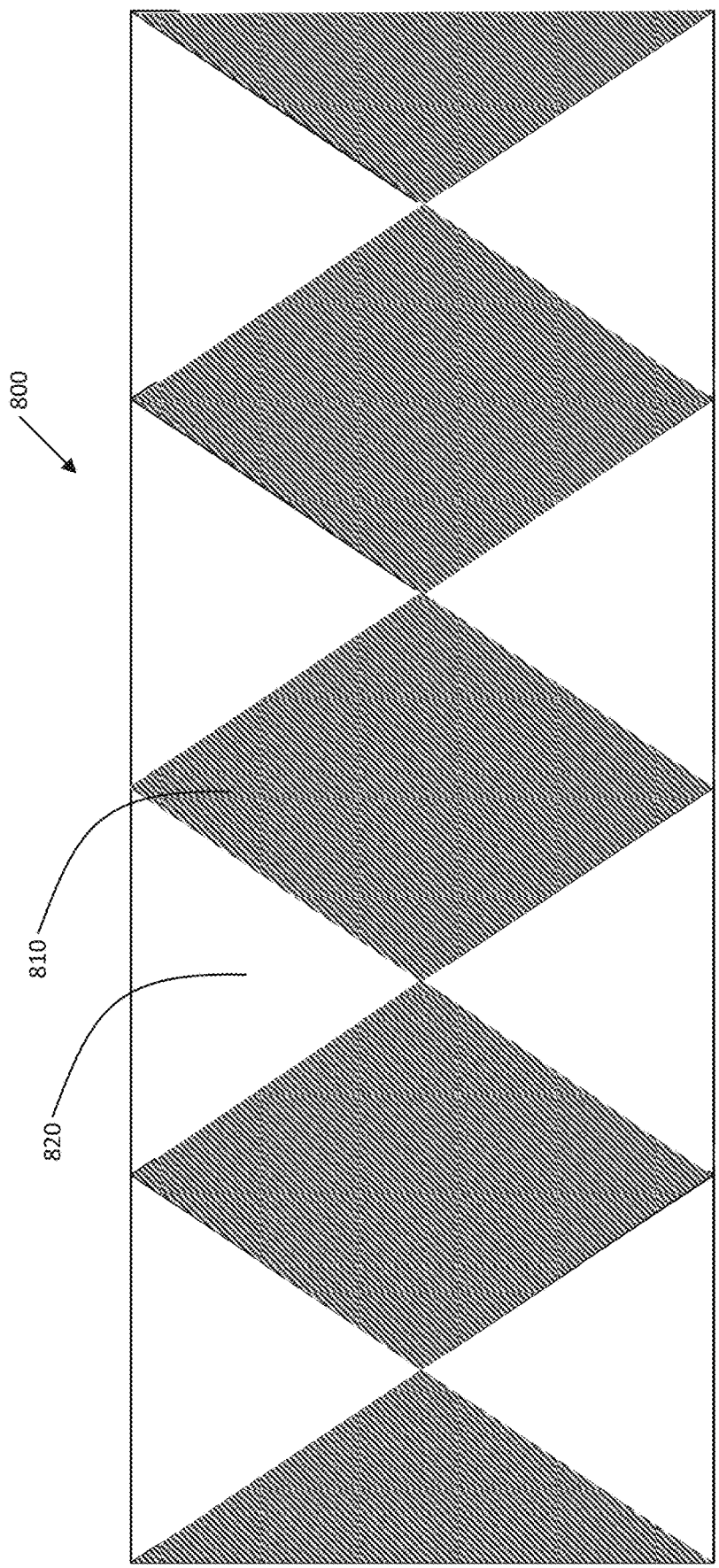
FIG. 8 shows the heat exchanger of FIG. 2 configured to provide multiple types of cooling using different coolant media in accordance with some embodiments.

The inventors have recognized and appreciated that the use of channel designs for heat exchangers in accordance with some embodiments, provides for the use of multiple unmixed coolants within the same integrated (e.g., one-piece construction) heat exchanger structure. Use of multiple unmixed coolants in an integrated heat exchanger structure reduces thermal efficiency losses and/or reduces the heat exchanger volume compared to multi-mode heat exchangers consisting of multiple connected single-mode heat exchangers, as discussed above. FIG. 8 shows an embodiment of an integrated multi-mode heat exchanger in which diamond-shaped channels 810 are filled with a first coolant (e.g., water) and triangle-shaped channels 820 are filled with a second coolant (e.g., air). Some embodiments include multiple fluid coolants having different properties such that heat transfer between channels (e.g., air to liquid, liquid to liquid) improves the cooling properties of a heat exchanger for a particular application.

As discussed above, the use of additive manufacturing to produce heat exchangers in accordance with the techniques described herein provides for substantial flexibility in designing channel designs for heat exchangers having any suitable number and shape of channels. An extension of this flexibility is the ability to optimize the proportion, size, shape, and/or spatial arrangement of channels for each of multiple coolants in the integrated heat exchanger structure. For example, the channel design pattern shown in FIG. 8 has a 1:1 ratio between the volume of channels for the first coolant and the second coolant. However, because each of the channels are independent and can be can be connected in any suitable way, any desired ratio may alternatively be used. In particular, channel designs that incorporate channels of different sizes, such as in the channel design of FIG. 5, may be particularly well-suited for providing multi-mode cooling where the channels are architected using additive manufacturing to provide any desired ratio.

Additionally, any combination of coolants may be used in a multi-mode heat exchanger designed in accordance with some embodiments. The inventors have recognized and appreciated that heat exchangers are often used in applications where multiple cooling modes, such as a steady-state cooling mode and a transient cooling mode, would be useful because the component being cooled generates occasional spikes of heat. For example, some electronics components with a short-term high-duty cycle may generate transient heat spikes that may be more effectively cooled using a phase-change material coolant than a fluid coolant. Accordingly, some embodiments are designed to incorporate different types of coolants that allow the heat exchanger to provide different modes of cooling. For example, a heat exchanger that includes both a fluid coolant (e.g., air, water) and a phase change material coolant (e.g., paraffin that changes state between a solid and a liquid) may provide both steady state cooling using the fluid coolant channels and transient cooling using the phase change material coolant channels to effectively provide cooling for a component or components that generate both steady state heat and occasional, transient, spikes in heat.

Figure 9:
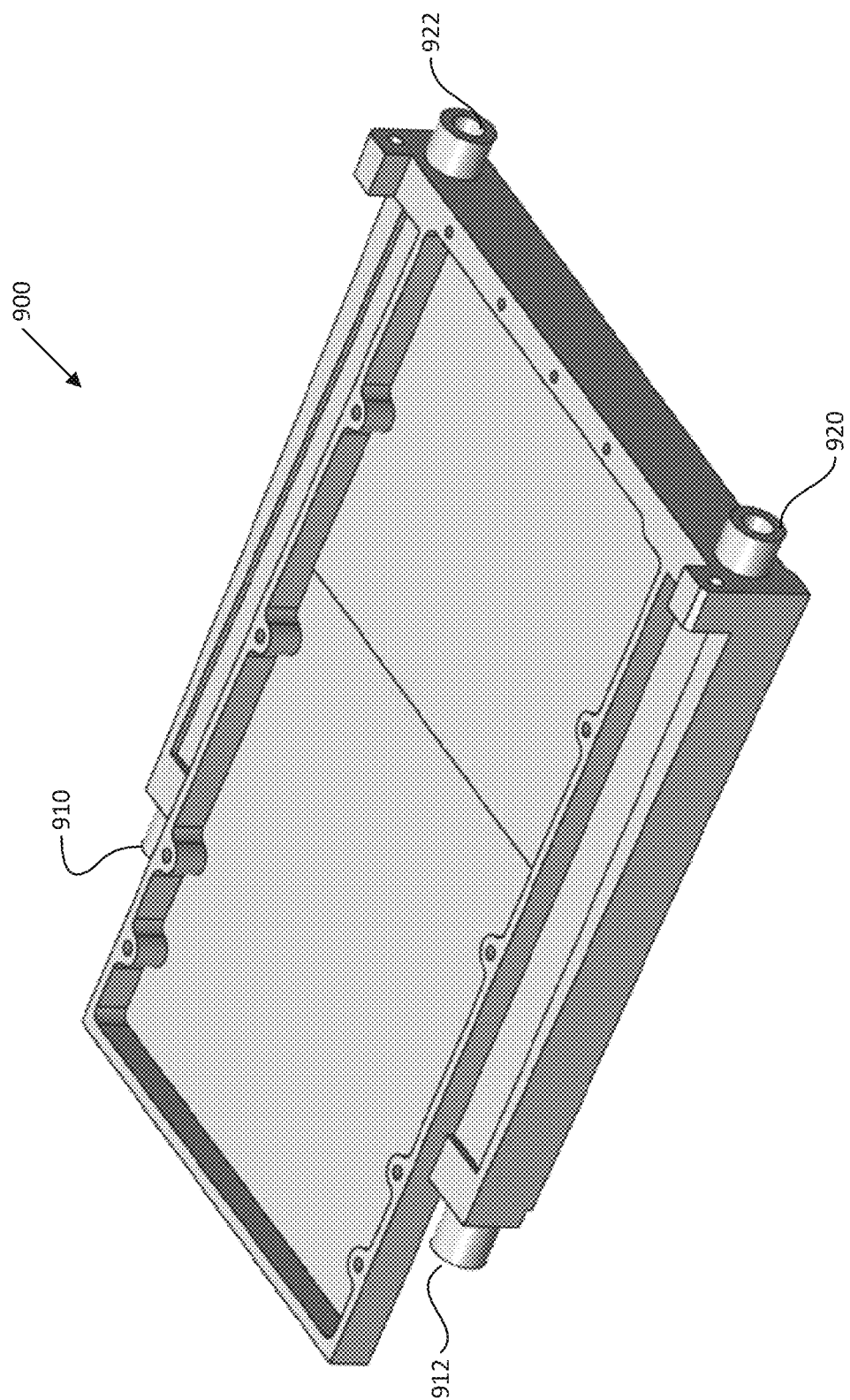
FIG. 9 shows a perspective view of a heat exchanger in accordance with some embodiments.
Figure 10:
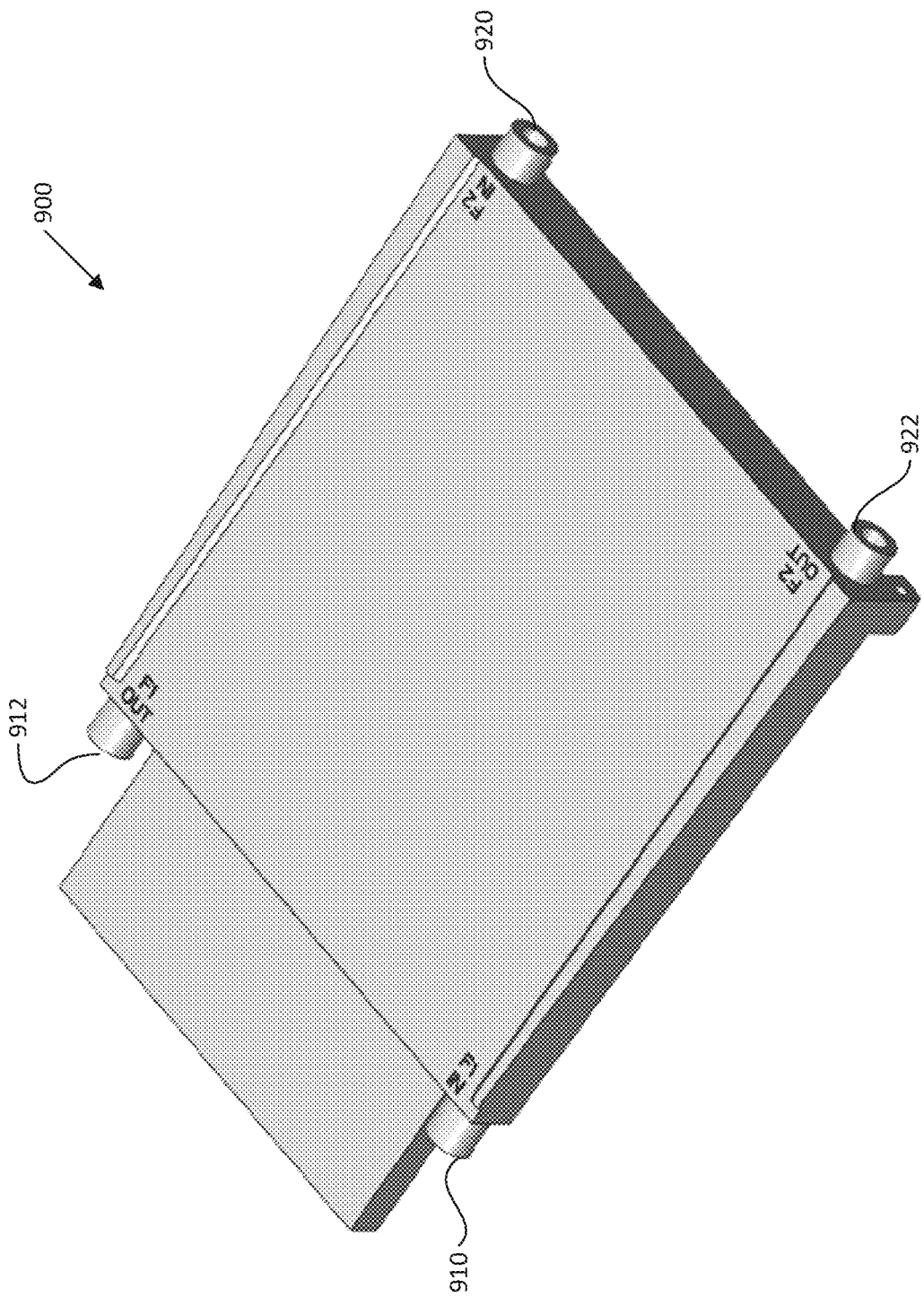
FIG. 10 shows an alternate view of the heat exchanger of FIG. 9.
Figure 11:
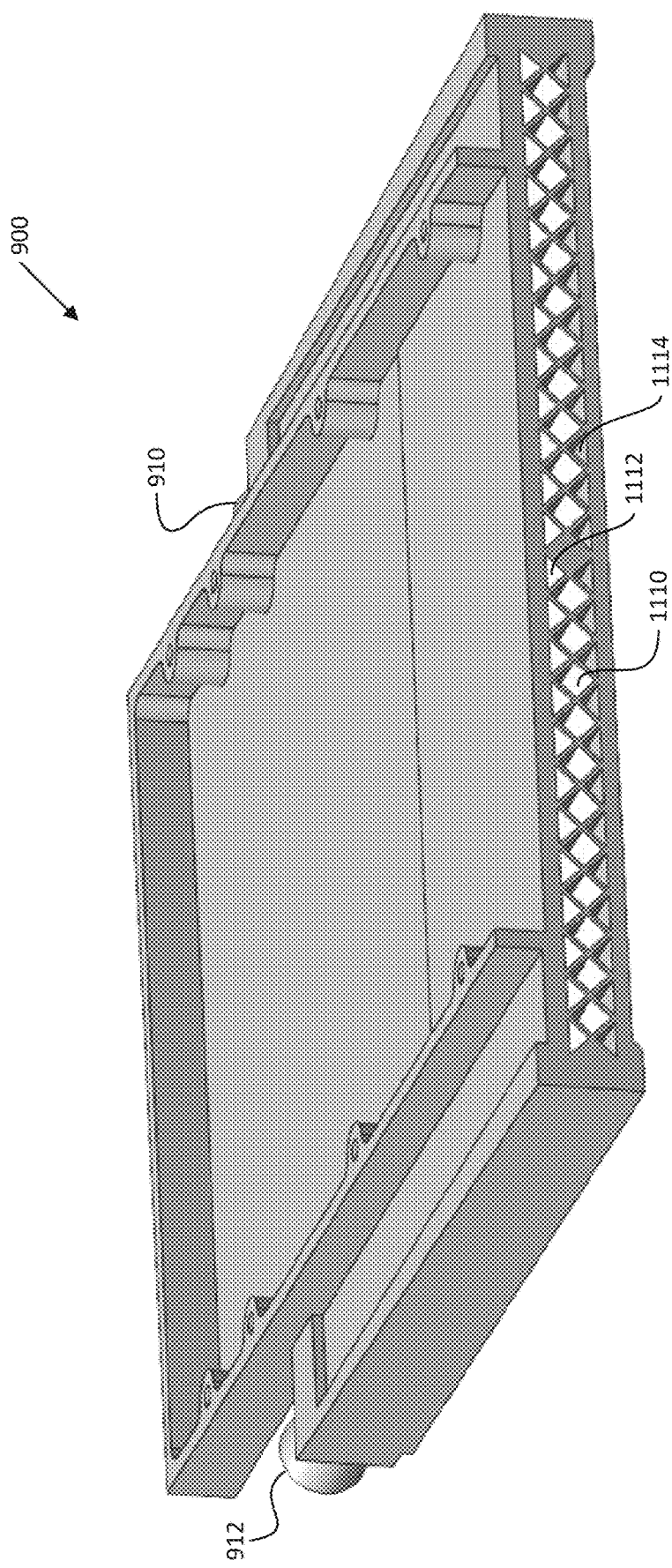
FIG. 11 shows a cross-section view through the heat exchanger of FIG. 9.

FIG. 9 illustrates the exterior of a heat exchanger 900 in accordance with some embodiments. Heat exchanger 900 includes a first inlet 910 and a first outlet 912 through which a first coolant (e.g., air) is circulated. Heat exchanger 900 also includes a second inlet 920 and a second outlet 922 through which a second coolant (e.g., water) is circulated. FIG. 10 shows an alternate view of heat exchanger 900 in which the inlets and outlets are labeled. FIG. 11 shows a cross-section through heat exchanger 900 revealing heat exchanger channels 1110, 1112, 1114 formed within the heat exchanger.

The channel design of heat exchanger 900 shown in FIG. 11 is similar to the channel design discussed above in connection with FIG. 8 and includes large diamond-shaped channels 1110, upper triangle channels 1112, and lower triangle channels 1114.

Figure 12A:
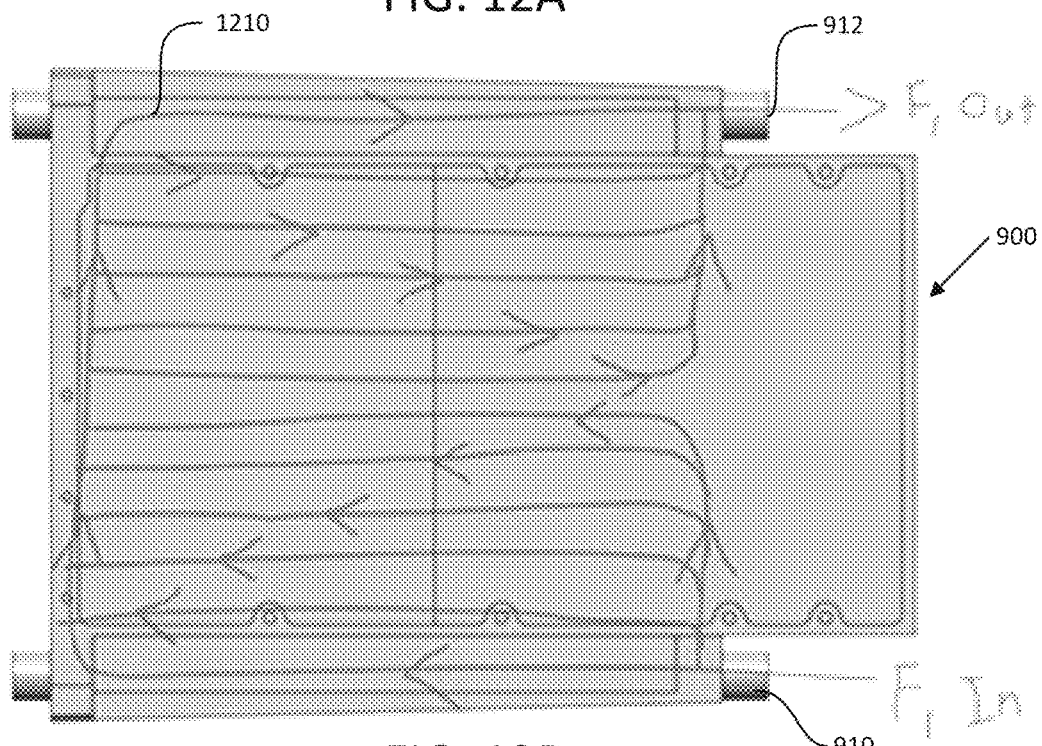
FIGS. 12A and 12B show manifold flow patterns for a first coolant media flowing through a first set of channels and a second coolant media flowing through a second set of channels, respectively, in accordance with some embodiments.
Figure 12B:
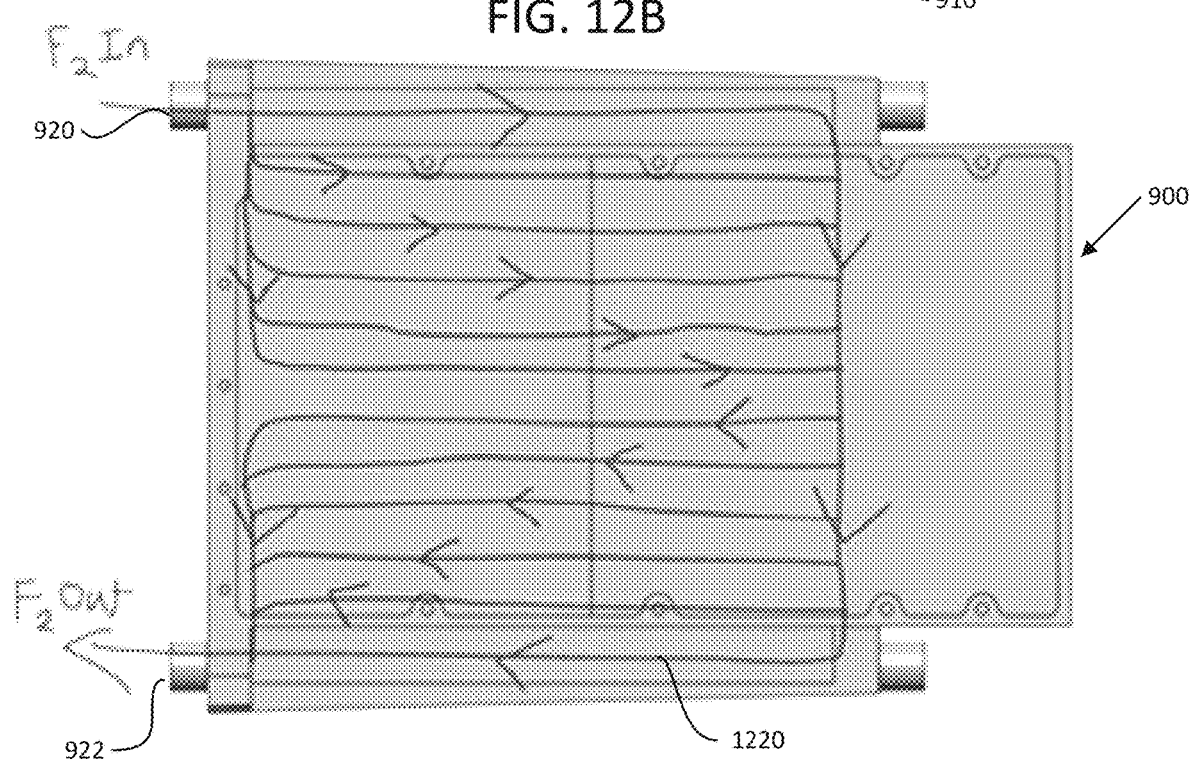

The heat exchanger channels of heat exchanger 900 may be connected in any suitable way to direct the flow of the multiple coolants through the heat exchanger in a desired manner, as discussed in more detail below. FIGS. 12A and 12B schematically illustrate a manifold flow 1210, 1220 of a first coolant $F_1$ and a second coolant $F_2$, respectively, through heat exchanger 900 in accordance with some embodiments. As shown in FIG. 12A, coolant $F_1$ enters inlet 910 and is directed to flow through multiple channels of the heat exchanger. When reaching the end of the heat exchanger opposite the inlet 910, the manifold directs coolant $F_1$ to the other side of the heat exchanger where the coolant is distributed to flow through multiple channels of the heat exchanger toward outlet 912, where coolant $F_1$ exits the heat exchanger. Similarly, FIG. 12B shows the manifold flow 1220 tracing the flow from inlet 920 to outlet 922. It should be appreciated that the manifold flows shown in FIGS. 12A and 12B are provided merely for illustration and any other suitable flow of coolant in heat exchangers designed in accordance with embodiments may be used.

Figure 13:
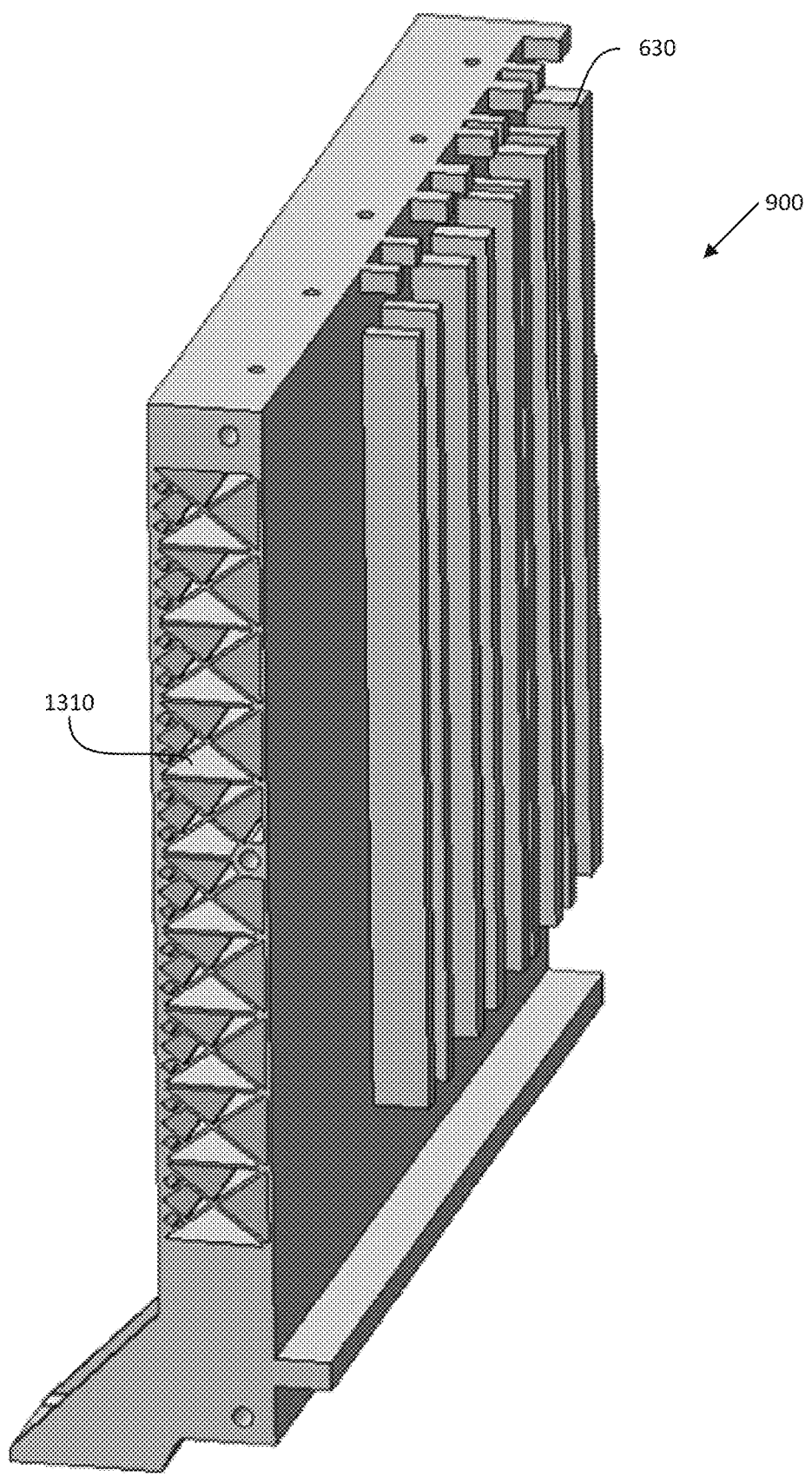
FIG. 13 shows a heat exchanger including a plurality of mounting structures in accordance with some embodiments.
Figure 14:
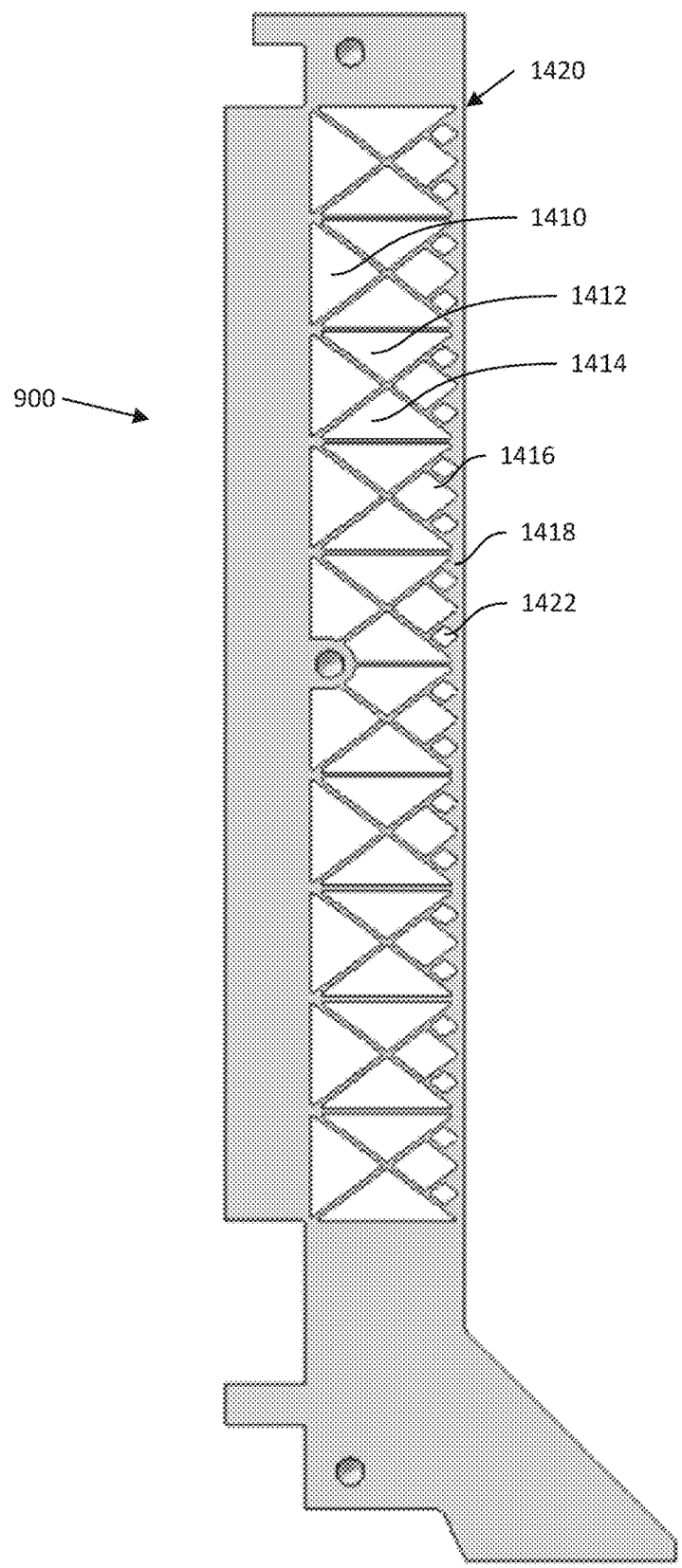
FIG. 14 shows a side view of the heat exchanger of FIG. 13 illustrating the channel pattern.
Figure 15:
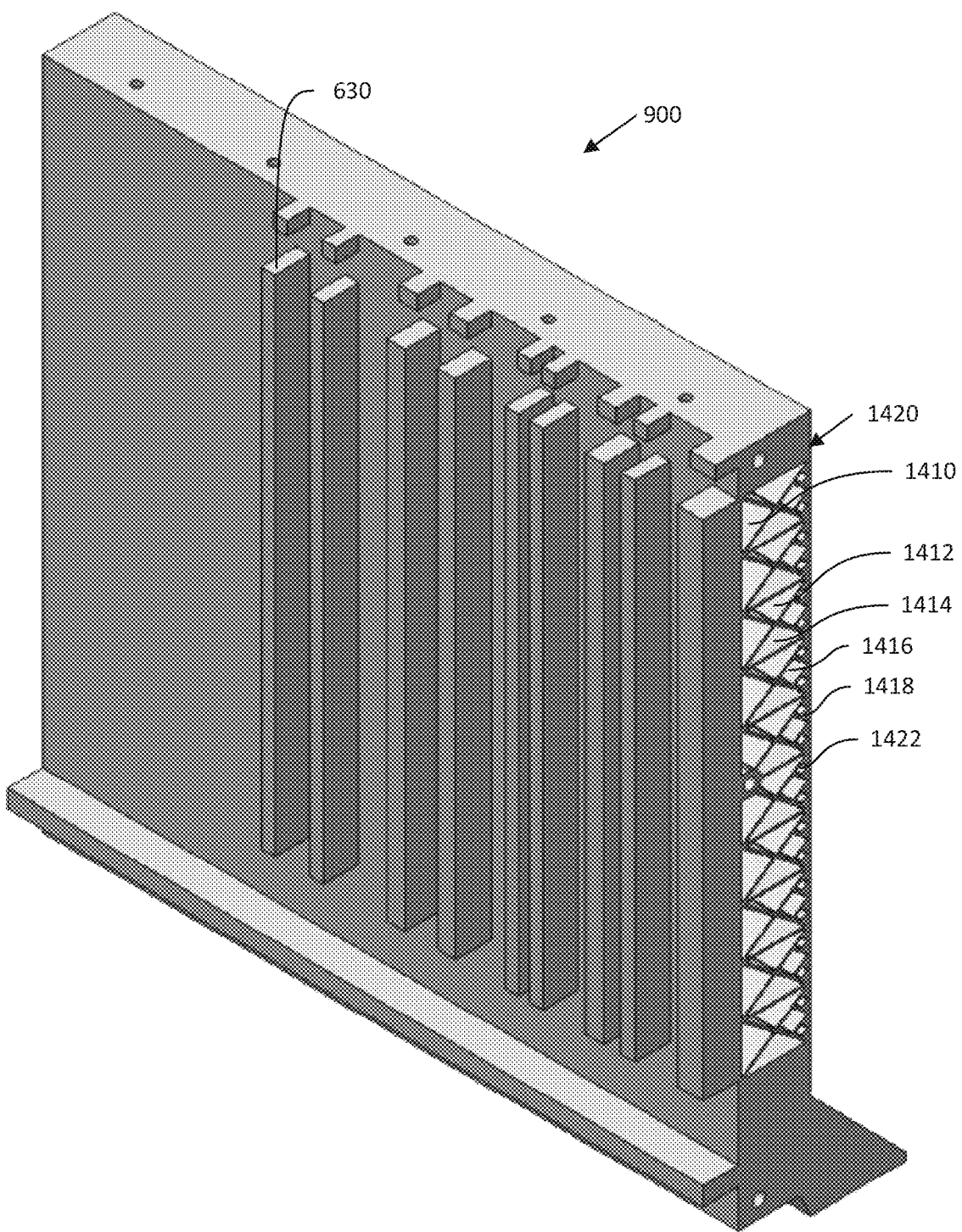
FIG. 15 shows an alternate view of the heat exchanger of FIG. 13.

FIG. 13 shows an alternate view of heat exchanger 900 in which mounting structures 630 are shown attached to the heat exchanger. A plurality of channels 1310 of different shapes and sizes formed within heat exchanger 900 are also shown. FIG. 14 shows a side-view cross-section of heat exchanger 900 in which the coolant channels are more clearly shown. The channel pattern design shown in FIG. 14 is similar to the channel pattern shown in FIG. 5, and described above. In particular, the channel pattern shown in FIG. 14 includes a lower triangle channel 1410, two middle triangle channels 1412, 1414, a smaller diamond-shaped channel 1416 formed in a layer above middle triangle channels 1412, 1414, and a smaller triangle channel 1418 formed in a layer above diamond-shaped channel 1416, where the smaller triangle channel 1418 is partially filled with a solid material to form a substantially flat surface 1420. To reduce the weight of the heat exchanger, additional diamond-shaped channels 1422 are formed in triangle channels 1418. Although diamond-shaped channels 1422 are described herein as performing a function of reducing weight of the heat exchanger, it should be appreciated that in some embodiments channels 1422 may also be used for cooling by having a coolant provided therein. FIG. 15 shows an alternate view of heat exchanger 900 in which the heat transfer channels and the mounting structures 630 are shown.

Figure 16A:
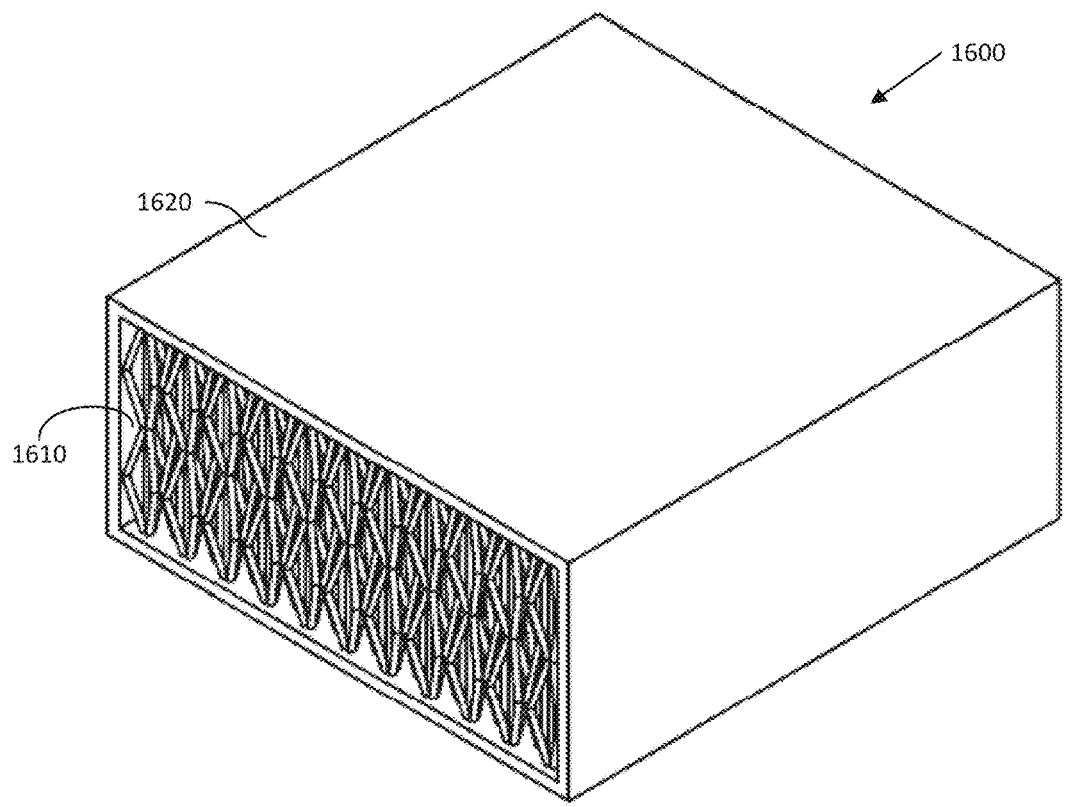
FIG. 16A shows an alternate design of a heat exchanger in accordance with some embodiments.
Figure 16B:
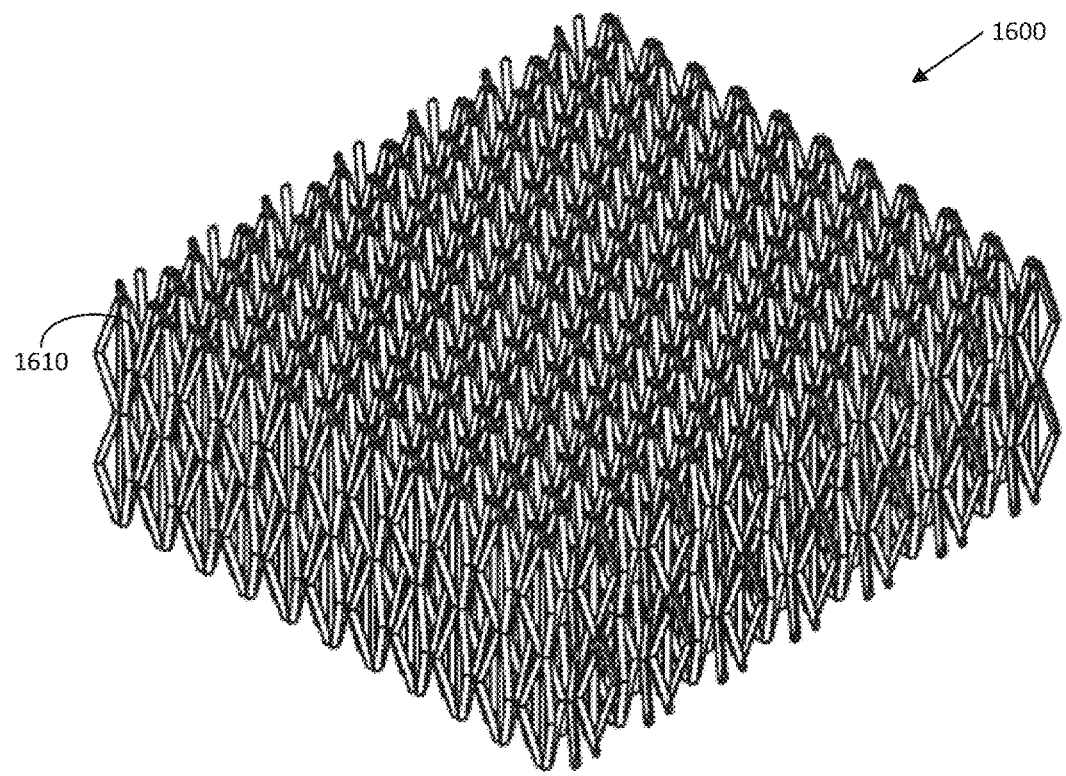
FIG. 16B shows a view of the internal structure of the heat exchanger of FIG. 16A.

FIG. 16A shows an alternate design for a heat exchanger 1600 in accordance with some embodiments. Heat exchanger 1600 includes a plurality of channels 1610 formed within an external structure 1620. FIG. 16B shows an alternate view of heat exchanger 1600 in which the external structure 1620 has been removed to provide a more detailed view of channel structure 1610. In the implementation shown, channel structure 1610 has been designed to maximize component surface area while minimizing the component volume. It should be appreciated, however that any other channel design may alternatively be used.

Figure 16C:
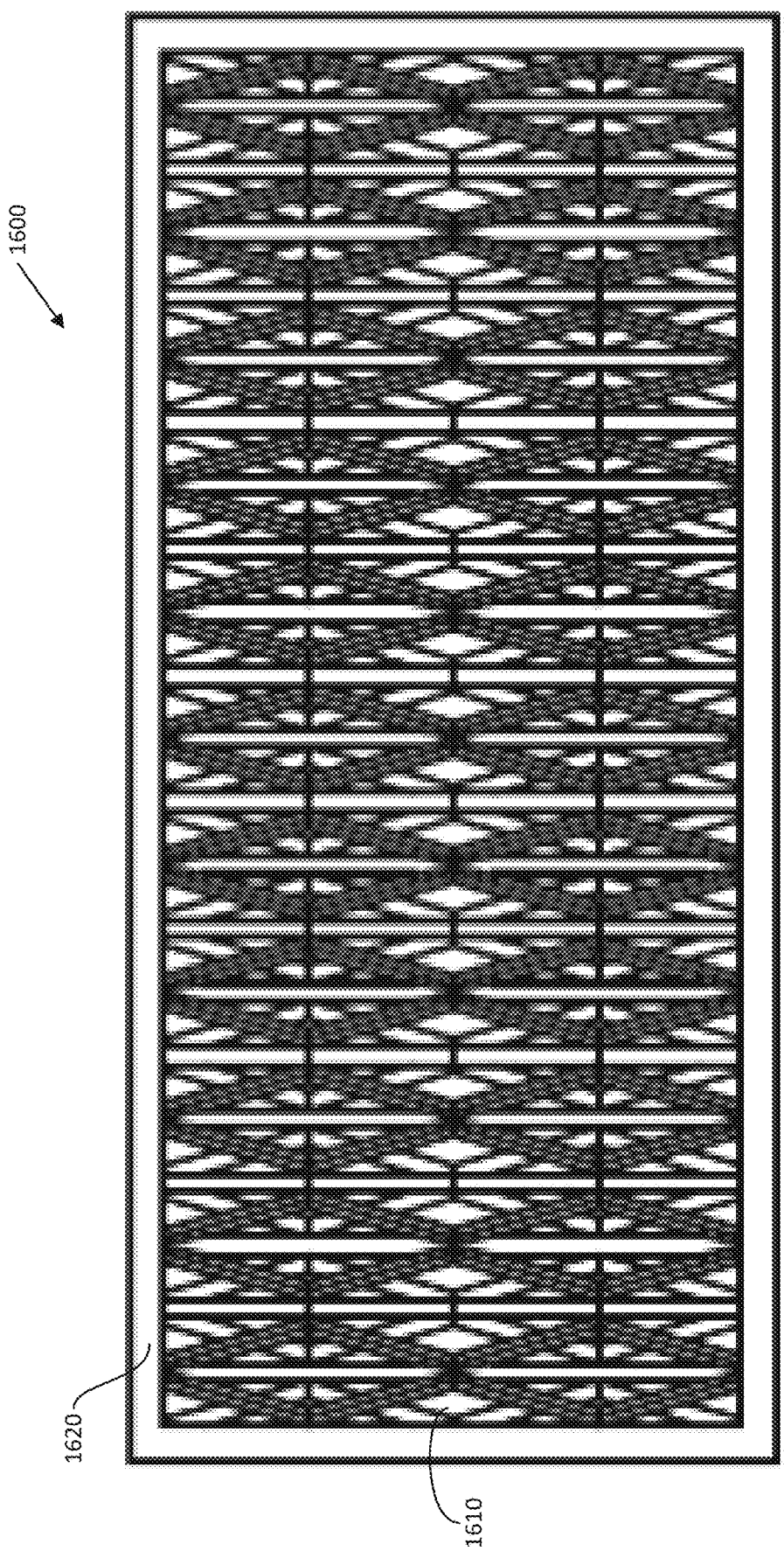
FIG. 16C shows a cross-section view through the heat exchanger of FIG. 16A.

FIG. 16C. shows a cross section through heat exchanger 1600 in which the coolant channels in channel structure 1610 are more clearly shown. Although not shown, in some embodiments, one or more of the channels of channel structure 1610 may be filled with solid material to form an upper interface control surface, as discussed above.

Figure 17:
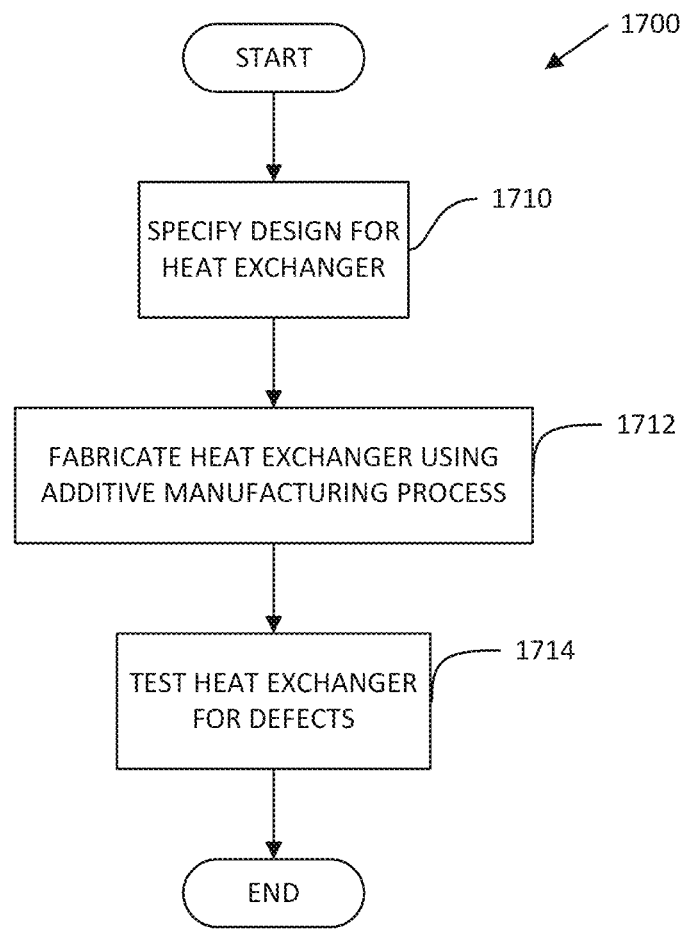
FIG. 17 shows a flowchart of a process for manufacturing a heat exchanger in accordance with some embodiments.

Some embodiments are directed to a method of manufacturing a heat exchanger using an additive manufacturing process. FIG. 17 shows a flowchart of a process 1700 for manufacturing a heat exchanger in accordance with some embodiments. In act 1710, a design for the heat exchanger is specified. The design may include the design of the one-piece body of the heat exchanger including any coolant inlets or outlets, one or more mounting structures, the design of the coolant channels, or any other suitable design features for structural components of the heat exchanger. A computer-aided design (CAD) program or other suitable software may be used to determine the design for the heat exchanger, and embodiments are not limited in how the design is specified.

The process then proceeds to act 1712, where the heat exchanger is fabricated using an additive manufacturing process, as described above. A 3D printer or other suitable apparatus for additive manufacturing produces layers of material (e.g., metal alloy) to fabricate the heat exchanger based on the specified design. The process then proceeds to act 1714, where the fabricated heat exchanger is tested for structural defects. Any suitable testing method including, but not limited to, using computed tomography (CT) may be used to test the components of the heat exchanger, and embodiments are not limited in this respect.

Having thus described several aspects of some embodiments of this invention, it is to be appreciated that various alterations, modifications, and improvements will readily occur to those skilled in the art.

Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method of manufacturing a heat exchanger, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A heat exchanger, comprising:
   a one-piece body; and
   a plurality of channels formed in the one-piece body, wherein
   the plurality of channels form a lattice having a plurality of layers including a first layer, a second layer, and a third layer,
   each of the first, second and third layers include channels arranged along a first dimension of the lattice,
   the first, second and third layers are arranged in order along a second dimension of the lattice orthogonal to the first dimension,
   channels within each of the first, second, and third layers have a same shape,
   a size of the channels having the same shape in the first, second, and third layers decreases in size from the first layer to the second layer to the third layer along the second dimension, and
   each of the channels in the second layer is positioned between two respective channels having larger dimensions than any of the channels in the second layer.

2. The heat exchanger of claim 1, wherein the same shape is a diamond shape.

3. The heat exchanger of claim 1, further comprising a plurality of structures formed adjacent to the lattice, wherein the plurality of structures form an interface control surface.

4. The heat exchanger of claim 3, wherein the interface control surface is a substantially-flat surface.

5. The heat exchanger of claim 3, wherein the plurality of structures are formed of a solid material.

6. The heat exchanger of claim 3, wherein at least some of the plurality of structures have a channel formed therein.

7. The heat exchanger of claim 3, further comprising at least one mounting structure formed adjacent to the plurality of structures.

8. The heat exchanger of claim 6, wherein the at least one mounting structure is configured to mount the heat exchanger to a component to be cooled by the heat exchanger.

9. The heat exchanger of claim 1, wherein a first set of the plurality of channels is configured to provide cooling using a first coolant medium and a second set of the plurality of channels is configured to provide cooling using a second coolant medium.

10. The heat exchanger of claim 9, wherein the first coolant medium is a fluid and the second coolant medium is a phase state change material.

11. The heat exchanger of claim 9, wherein a combined volume of channels in the first set is greater than a combined volume of the channels in the second set.

12. The heat exchanger of claim 1, wherein the one-piece body comprises a metal alloy manufactured using an additive manufacturing process, wherein the plurality of channels in the lattice are arranged to avoid unsupported overhang portions of material in the one-piece body.

13. The heat exchanger of claim 1, wherein a first channel in the first layer of the lattice shares a channel wall with a second channel in the second layer of the lattice.

14. The heat exchanger of claim 1, wherein at least one channel of the plurality of channels has a channel wall thickness of 0.015 inches.

15. The heat exchanger of claim 1, wherein a first channel wall of a channel in the second layer of the lattice extends from a point on a channel wall of a first of the two respective channels having larger dimensions and a second channel wall of the channel in the second layer of the lattice extends from a point on a channel wall of a second of the two respective channels having larger dimensions.

16. The heat exchanger of claim 1, wherein a shape of one channel of the plurality of channels is determined, at least in part, by a shape of two or more other channels of the plurality of channels.

* * * * *